(12) United States Patent
Chen et al.

(10) Patent No.: US 9,383,409 B2
(45) Date of Patent: Jul. 5, 2016

(54) METHOD OF DIAGNOSABLE SCAN CHAIN

(71) Applicant: International Business Machines Corporation, Armonk, NY (US)

(72) Inventors: Liang Chen, Shanghai (CN); Guofan Jiang, Shanghai (CN); Teng Lin, Beijing (CN); Yang Liu, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/871,224

(22) Filed: Apr. 26, 2013

(65) Prior Publication Data

US 2013/0297980 A1    Nov. 7, 2013

(30) Foreign Application Priority Data

Apr. 27, 2012    (CN) .......................... 2012 1 0130364

(51) Int. Cl.
  *G01R 31/28*    (2006.01)
  *G01R 31/3177*    (2006.01)
  *G01R 31/3185*    (2006.01)

(52) U.S. Cl.
  CPC .... *G01R 31/3177* (2013.01); *G01R 31/318583* (2013.01)

(58) Field of Classification Search
  None
  See application file for complete search history.

(56) References Cited

U.S. PATENT DOCUMENTS

| | | | | |
|---|---|---|---|---|
| 4,959,832 A | * | 9/1990 | Bardell, Jr. | ..................... 714/739 |
| 5,278,842 A | * | 1/1994 | Berry et al. | ..................... 714/726 |
| 5,881,067 A | | 3/1999 | Narayanan et al. | |
| 6,308,290 B1 | | 10/2001 | Forlenza et al. | |
| 6,490,702 B1 | | 12/2002 | Song et al. | |
| 6,961,886 B2 | | 11/2005 | Motika et al. | |
| 6,976,199 B2 | * | 12/2005 | Berry et al. | ..................... 714/726 |
| 6,996,791 B2 | | 2/2006 | Brunkhorst et al. | |
| 7,007,214 B2 | | 2/2006 | Eustis et al. | |

(Continued)

FOREIGN PATENT DOCUMENTS

| | | |
|---|---|---|
| CN | 101315412 A | 12/2008 |
| CN | 101846724 A | 9/2010 |
| CN | 103376405 A | 10/2013 |

OTHER PUBLICATIONS

Diagnosis of VLSI circuit defects: defects in scan chain and circuit logic, Xun Tang, University of Iowa pp. 119-126. Dec. 1, 2010.

(Continued)

*Primary Examiner* — Daniel McMahon

(74) *Attorney, Agent, or Firm* — L. Jeffrey Kelly; Steven Meyers

(57) ABSTRACT

A method for implementing a scan chain to test a semiconductor including obtaining an initial structure of the scan chain, determining, according to function modules of the semiconductor corresponding to scan registers on the scan chain, a first scan register pair with backward dependency, adjusting a structure of the scan chain such that the first scan register pair with backward dependency becomes a scan register pair with forward dependency, when a fan-in scan register in the scan register pair with backward dependency belongs to the key subset of the fan-out scan register in the first scan register pair with backward dependency, and determining a key subset of a fan-out scan register in the first scan register pair with backward dependency, wherein when all fan-in scan registers in the key subset reflect a same logic value, an output logic value of a function module connected to the fan-out scan register is fixed.

8 Claims, 10 Drawing Sheets

(56) References Cited

U.S. PATENT DOCUMENTS

| | | | |
|---|---|---|---|
| 7,131,081 B2 * | 10/2006 | Wang et al. | 716/136 |
| 7,194,706 B2 | 3/2007 | Adkisson et al. | |
| 7,240,261 B2 | 7/2007 | Huisman et al. | |
| 7,343,536 B2 | 3/2008 | Han et al. | |
| 7,478,296 B2 * | 1/2009 | Rajski et al. | 714/726 |
| 7,506,232 B2 * | 3/2009 | Rajski et al. | 714/728 |
| 7,558,996 B2 | 7/2009 | Kiryu | |
| 7,788,058 B2 | 8/2010 | Song et al. | |
| 7,895,487 B2 | 2/2011 | Huisman et al. | |
| 7,908,534 B2 | 3/2011 | Motika et al. | |
| 8,006,152 B2 | 8/2011 | Ward et al. | |
| 8,086,924 B2 | 12/2011 | Forlenza et al. | |
| 2004/0177299 A1 | 9/2004 | Wang et al. | |
| 2004/0246337 A1 * | 12/2004 | Hasegawa et al. | 348/189 |
| 2004/0268195 A1 | 12/2004 | Eustis et al. | |
| 2005/0114747 A1 | 5/2005 | Brunkhorst et al. | |
| 2009/0235134 A1 | 9/2009 | Guo et al. | |
| 2010/0293422 A1 | 11/2010 | Huang et al. | |

OTHER PUBLICATIONS

IEEE "Observation point oriented deterministic diagnosis pattern generation (DDPG) for chain diagnosis." Fei Wang . 17th Asian Test Symposium pp. 187-190 , Nov. 24, 2008.

EEE "Partner SRLS for Improved Shift Register Diagnostics", James Schafer, Fred Pollcastri, Richard McNulty. VSLI Test Symposium , pp. 198-201; Apr. 7, 1992.

IEEE "Diagnosis of Scan Path Failures," Samantha Edirisooriya, Geetani Edirisooriya, Proc. VLSI Test Symposium, pp. 250-255, May 3, 1995.

IEEE "A Complete Test Set to Diagnose Scan Chain Failures," Ruifeng Guo, Yu Huang, Wu-Tung Cheng. Proc. International Test Conference ,Paper 7.2; pp. 1-10, Oct. 21, 2007.

* cited by examiner

METHOD OF DIAGNOSABLE SCAN CHAIN

BACKGROUND

The present invention relates to design technology of integrated circuits, and more specifically, to a method and apparatus for diagnosing a scan chain.

With advances of semiconductor technology, the design and manufacture of semiconductors become more and more complex. Such complexity improves the performance of semiconductor integrated circuits and also increases the possibility of generating defects. Therefore, testing technology becomes increasingly important. For example, after the front-end design of a semiconductor integrated circuit is completed, usually it is subjected to a logical test, so as to ensure that the logical design itself is correct. Typically the logical test is also called verification. After the completion of the logical test, a netlist is generated through synthesis steps, so as to be used in physical manufacture. In this regard, scanning technology is needed for a physical test of manufactured integrated circuits. This is because it is impossible to completely learn internal state information by observing signals on pins of integrated circuits, while the scanning technology can transfer the internal state information of integrated circuits off-chip using dedicated pins.

In order to use scanning technology in a physical test, it is necessary to add scan chains to the netlist as generated from a logic synthesis process. As will be appreciated by one skilled in the art, for the purpose of signal stability, the output of each function module inside an integrated circuit is not directly connected to the input of the next level but first connected to the input of a register whose output is then connected to the input of the next level. The function modules mentioned here are modules needed for fulfilling the function of the integrated circuit itself, such as respective logic gates and various operators, etc. A scan chain is formed by part or all of these registers, and a register used for forming a scan chain may be termed a scan register. Adding a scan chain to a netlist is to add a direct connection between scan registers so as to serially connect the scan registers, and to add a corresponding scan chain management module.

Under the control of a scan chain management module, a scan register may be in a scan mode or a function mode. In the scan mode, one scan chain may be regarded as one shift register, that is, the input of a downstream scan register is connected to the output of an upstream scan register. A group of logic values may be written into each scan register via shift-in, and also logic values may be read from each scan register via shift-out. Here, the upstream refers to a starting point closer to the scan chain, i.e., an integrated circuit pin that inputs a shift-in logic value to the scan chain and the downstream refers to an ending point closer to the scan chain, i.e., an integrated circuit pin that reads a shift-out logic value from the scan chain. In the function mode, the input of a scan register is connected to the output of a function module. The switch between the scan mode and the function mode may be implemented by a multiplexer (MUX) connected at the input end of the scan register.

The physical test of an integrated circuit by using the scanning technology comprises three basic steps. The first one is a shift-in step. In the scan mode, a shift-in operation is performed in which each scan register is set to a desired logic value. Since the output of each scan register is further connected to the input of a function module, the input of each scan register is also set to a desired logic value. The second one is a processing step. In the function mode, one or more clock cycles are provided to each function module so that each function module processes an inputted logic value according to a clock signal. Since the scan register is in the function mode, its input is connected to the output of each function module so that a processing result of each function module is saved in the scan register. The third one is a shift-out step. In the scan mode, a shift-out operation is performed so that the output of each function module which is saved in each scan register is read at the outside of the integrated circuit. With the knowledge of the input and output of each function module in the integrated circuit, it is possible to judge whether each function module operates normally or not.

Whether the above steps of the physical test are accurate or not, it depends on whether the scan chain operates normally or not. Therefore, there is a need for a series of methods for diagnosing scan chains.

SUMMARY

Embodiments of the present invention provide a method and apparatus for diagnosing a scan chain.

A method for a scan chain according to one embodiment of the present invention comprises: obtaining an initial structure of the scan chain; determining at least one scan register pair with backward dependency, according to function modules corresponding to scan registers on the scan chain; and adjusting the structure of the scan chain such that the at least one scan register pair with backward dependency becomes a scan register pair with forward dependency.

The apparatus for a scan chain according to one embodiment of the present invention comprises: an obtaining module configured to obtain an initial structure of the scan chain; a determining module configured to determine at least one scan register pair with backward dependency, according to function modules corresponding to scan registers on the scan chain; and an adjusting module configured to adjust the structure of the scan chain so that the at least one scan register pair with backward dependency becomes a scan register pair with forward dependency.

According to embodiments of the present invention, the diagnosability of scan chains can be enhanced.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

Figure 1:
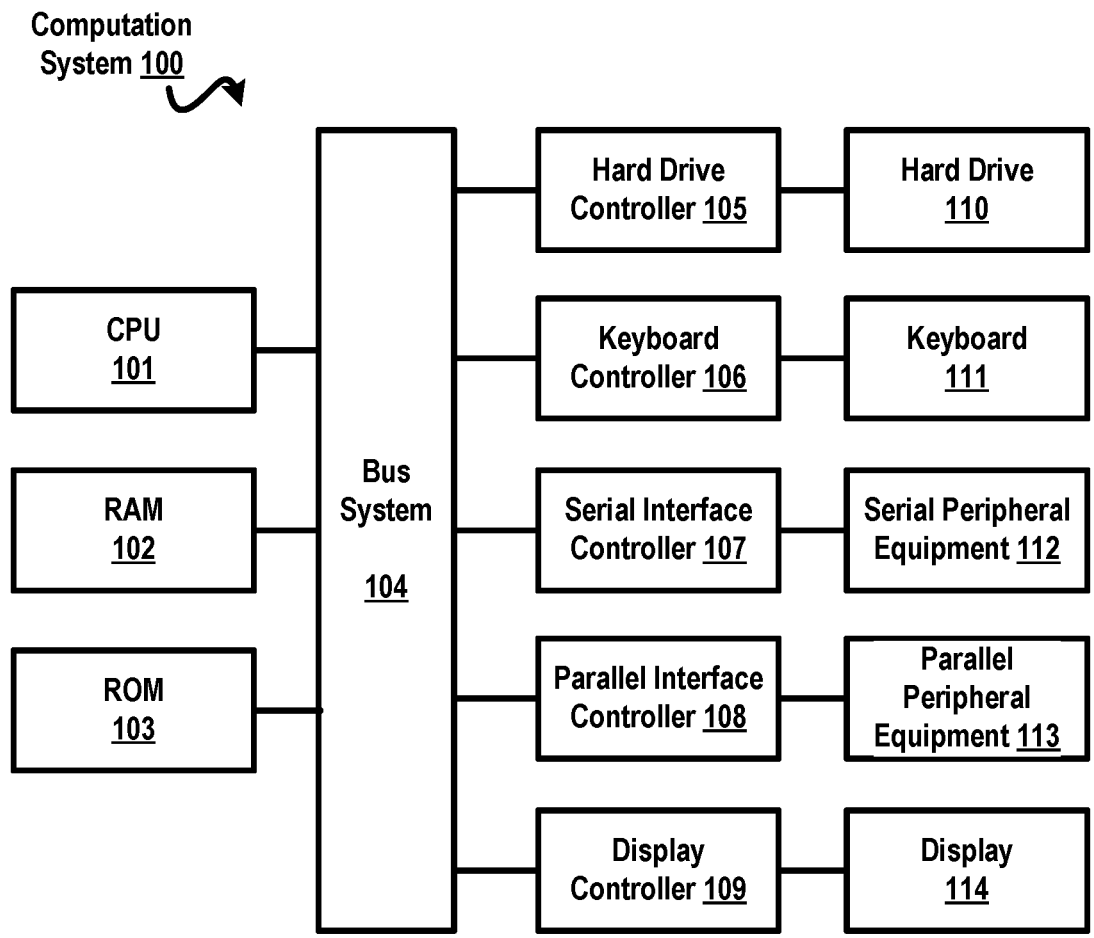
FIG. 1 illustrates an exemplary computer system 100 which is applicable to implement the embodiments of the present invention.

FIG. 1 illustrates an exemplary computer system 100 which is applicable to implement the embodiments of the present invention. As illustrated in FIG. 1, the computer system 100 may include: CPU (Central Process Unit) 101, RAM (Random Access Memory) 102, ROM (Read Only Memory) 103, System Bus 104, Hard Drive Controller 105, Keyboard Controller 106, Serial Interface Controller 107, Parallel Interface Controller 108, Display Controller 109, Hard Drive 110, Keyboard 111, Serial Peripheral Equipment 112, Parallel Peripheral Equipment 113 and Display 114. Among above devices, CPU 101, RAM 102, ROM 103, Hard Drive Controller 105, Keyboard Controller 106, Serial Interface Controller 107, Parallel Interface Controller 108 and Display Controller 109 are coupled to the System Bus 104. Hard Drive 110 is coupled to Hard Drive Controller 105. Keyboard 111 is coupled to Keyboard Controller 106. Serial Peripheral Equipment 112 is coupled to Serial Interface Controller 107. Parallel Peripheral Equipment 113 is coupled to Parallel Interface Controller 108. And, Display 114 is coupled to Display Controller 109. It should be understood that the structure as illustrated in FIG. 1 is only for the exemplary purpose rather than any limitation to the present invention. In some cases, some devices may be added to or removed from the computer system 100 based on specific situations.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or one embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As described above, to conduct a physical test on an integrated circuit by using scanning technology, it is necessary to ensure that a scan chain itself operates normally. In modern integrated circuits, circuit elements related to a scan chain occupy 10% to 30% of the entire area of an integrated circuit, so the probability that a fault occurs in the scan chain is unquestionably high. Since the scan chain is essentially a shift register, the fault effect of the scan chain is global due to shift operations like shift-in and shift-out. For example, if a scan register in the scan chain has a stuck-at-1 (SA1) fault, then each downstream scan register will be set to have logic value 1 during shift operations. In this manner, the logic value set to a downstream scan register will be affected during a shift-in operation, while the logic value read from an upstream scan register will be affected during a shift-out operation.

Figure 2A:
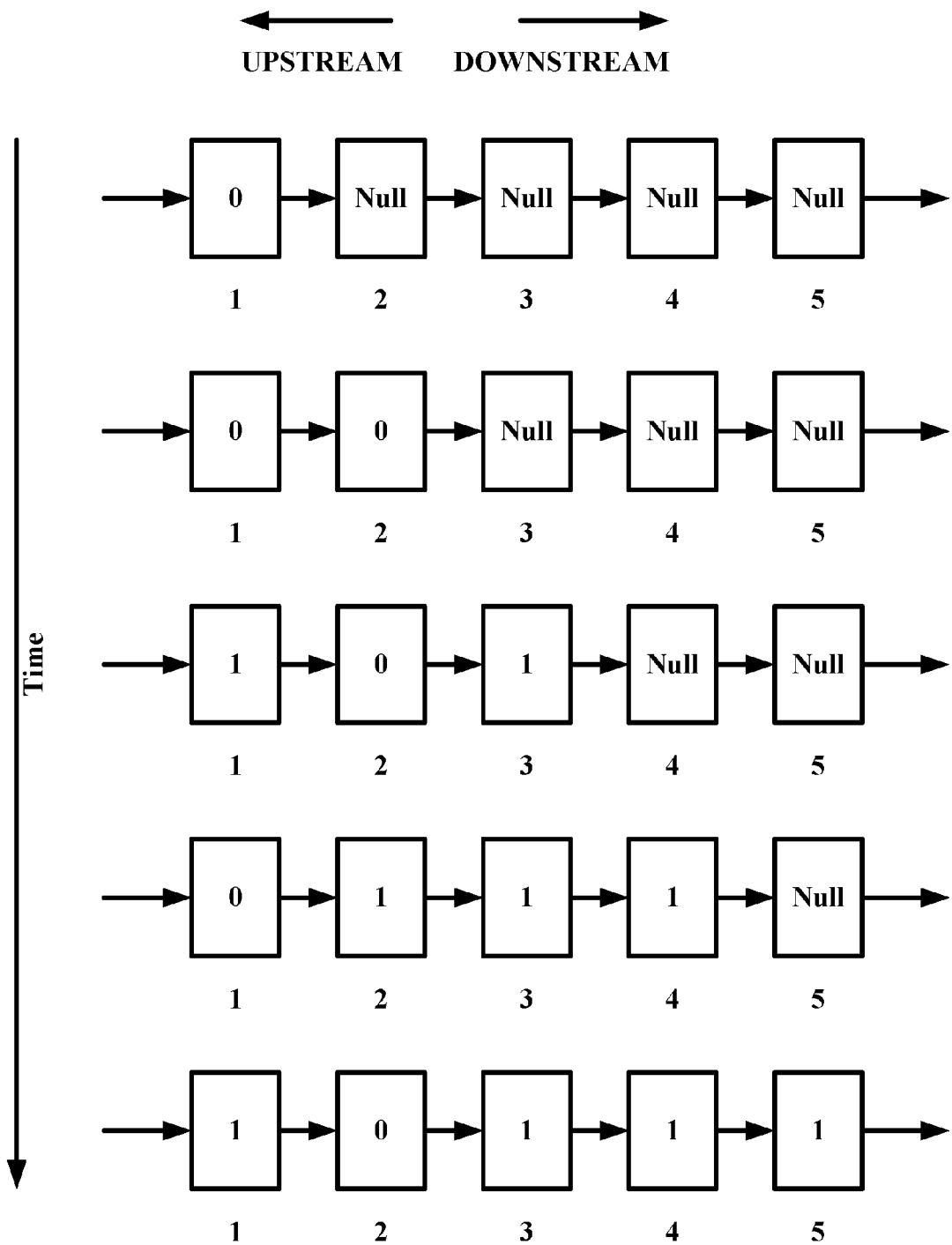
FIGS. 2A and 2B each are a schematic view of a fault in a scan register.
Figure 2B:
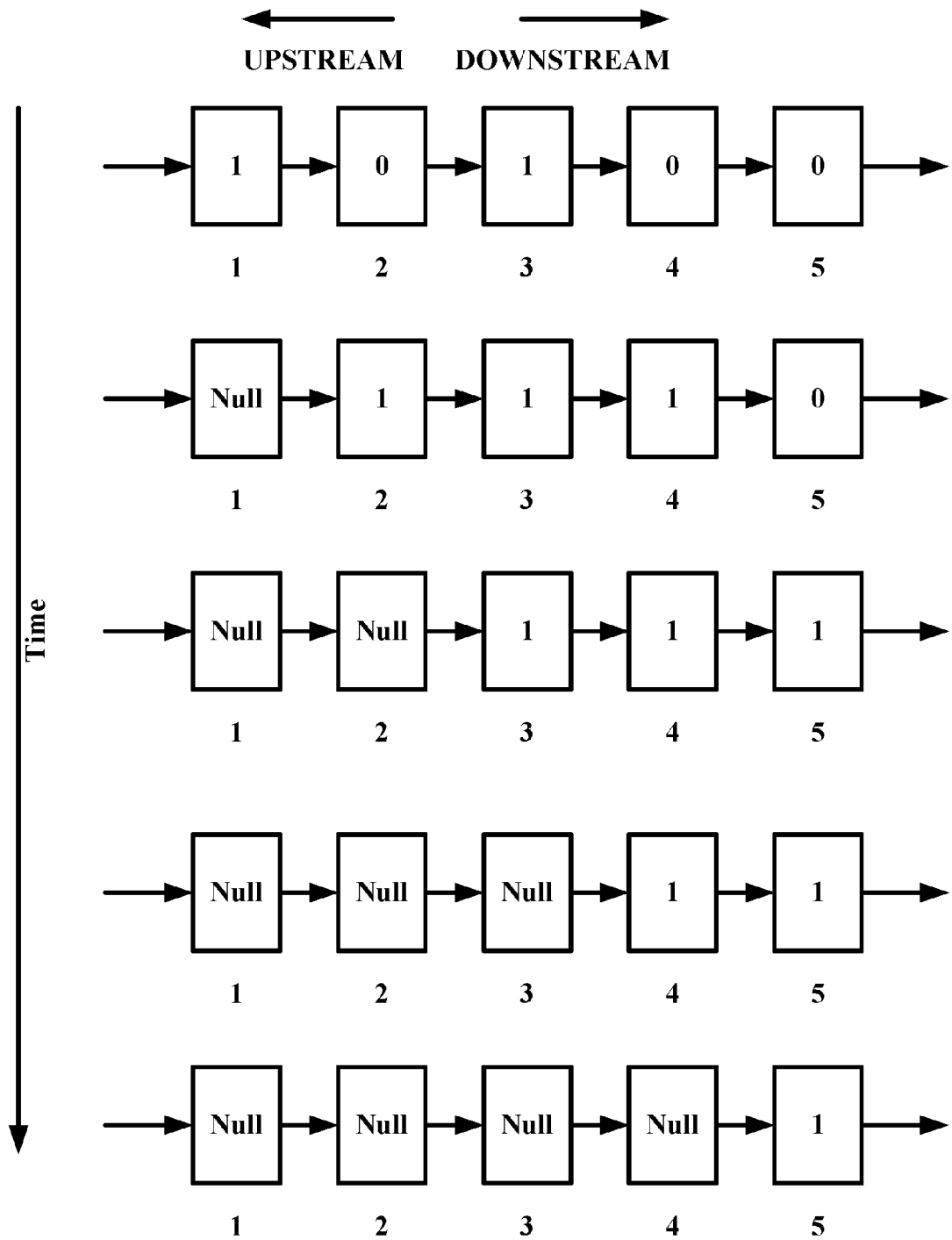

FIG. 2A and FIG. 2B each illustrate a schematic view of how a fault propagates in a scan chain. In FIG. 2A and FIG. 2B, suppose scan register No. 3 has an SA1 fault. In addition, since no function module is involved, a multiplexer MUX at the input of the scan register is neglected.

In FIG. 2A, suppose logic values to be set to respective scan registers are illustrated as below, and Null indicates that no logic value has been set to this scan register.

| No. 1 | No. 2 | No. 3 | No. 4 | No. 5 |
|---|---|---|---|---|
| 1 | 0 | 1 | 0 | 0 |

As illustrated in FIG. 2A, since scan register No. 3 has an SA1 fault, actual logic values set to respective scan registers are:

| No. 1 | No. 2 | No. 3 | No. 4 | No. 5 |
|---|---|---|---|---|
| 1 | 0 | 1 | 1 | 1 |

It can be seen that logic values set to downstream scan registers No. 4 and No. 5 are affected.

In FIG. 2, suppose current logic values of respective scan registers are as illustrated below, and Null indicates that a logic value of this scan register has been read to a downstream scan register. A current logic value of a scan register may be read from a corresponding function module in the function mode.

| No. 1 | No. 2 | No. 3 | No. 4 | No. 5 |
|---|---|---|---|---|
| 1 | 0 | 1 | 0 | 0 |

As illustrated in FIG. 2B, since scan register No. 3 has an SA1 fault, actual logic values shifted out of respective scan registers are:

| No. 1 | No. 2 | No. 3 | No. 4 | No. 5 |
|---|---|---|---|---|
| 1 | 1 | 1 | 0 | 0 |

It can be seen that logic values read from upstream scan registers No. 1 and No. 2 are affected.

In the following description, illustration is made only in the context that a scan register has an SA1 fault. Those skilled in the art may appreciate that the method according to one embodiment of the present invention is also applicable in circumstances where a scan register experiences other faults.

A bypass diagnostic method may be used to help locate a scan register with an SA1 fault in a scan chain. In examples of FIG. 2A and FIG. 2B, since scan register No. 3 has an SA1 fault, all logic values passing scan register No. 3 become 1. Even if logic values shift-in to the scan chain are 0, logic value shift out of the scan chain are all 1. The basic principle of the bypass diagnostic method is that during shift operations, a certain scan register is bypassed, so that the impact of this scan register on downstream scan registers is isolated. By setting different scan registers in a bypass mode and shifting-in a specific logic value combination, it is possible to locate a scan register with an SA1 fault in the scan chain. The specific logic value combination may be generated using automatic test pattern generation (ATPG). As ATPG is a common technical means in the art, it is not detailed here.

As described above, when shifting-in or shifting-out a logic value, the input of a downstream scan register is the output of an upstream scan register. Referring to FIG. 2A and FIG. 2B, to bypass scan register No. 3, the output of scan register No. 2 may be connected to the input of an auxiliary register corresponding to scan register No. 3, and the output of the auxiliary register may be connected to the input of scan register No. 4. It will be easily appreciated that this method will greatly increase the area overhead of circuit elements related to the scan chain. First, a selector requires dedicated layout area. For example, a selector at the input end of scan register No. 4 selects one of the output of scan register No. 3 and the output of the auxiliary scan register. Second, the auxiliary register itself also expends layout area overhead. Lastly, the length of wiring needs to be increased if a solution that multiple scan registers share one auxiliary register or a scan register at other location in the scan chain is taken as the auxiliary register. This also increases area overhead.

To reduce the additional area overhead needed by the bypass diagnostic method, a function unit may be used as a bypass pathway in place of the auxiliary register. The steps of the bypass diagnostic method of replacing the auxiliary register by the function unit are similar to those of conducting a physical test using scanning technology, i.e., comprising a shift-in step, a processing step, and a shift-out step. In other words, in the function mode, a logic value saved in an upper-level scan register is input to each function module, each function module is caused to process the logic value according to a clock signal, and a processing result of each function module is output to a lower-level scan register, which corresponds to bypassing an upper-level scan register. Hence, by using a function module as a bypass pathway, it is possible to determine whether a scan register with a fault is located at an upstream location or a downstream location of some reference scan register. If the scan register with a fault is not located at an upstream location or a downstream location of the reference scan register, then it indicates that the reference scan register itself has a fault.

Hereinafter, how to determine a scan register with an SA1 fault is illustrated by way of example. Suppose scan register No. 4 is a reference scan register, then a logic value combination set to respective scan registers in the shift-in step should satisfy that scan register No. 4 and its downstream scan register No. 5 are both 1, and scan registers No. 1, No. 2 and No. 3 upstream to scan register No. 4 may be any logic values. In addition, for a function unit outputted to scan register No. 4, it is necessary to control an inputted logic value of the function unit such that the function unit outputs 0 when the processing step ends. Through the processing step, a logic value in register No. 4 should be 0. The shift-out step is performed at this point. If it is observed that a logic value in scan register No. 4 is 0, it indicates that neither of scan registers No. 4 and No. 5 has an SA1 fault. Hence, the SA1 fault must occur in at least one of scan registers No. 1, No. 2, and No. 3.

Similarly, if scan register No. 3 is taken as a reference scan register, then a logic value combination set to respective scan registers should satisfy that scan register No. 3 and its downstream scan registers No. 4 and No. 5 are all 1, while scan registers No. 1 and No. 2 upstream to scan register No. 3 may be any logic values. In addition, for a function unit outputted to scan register No. 3, it is necessary to control an inputted logic value of the function unit such that the function unit outputs 0 when the processing step ends. Through the processing step, a logic value in register No. 3 should be 0. The shift-out step is performed at this point. If it is observed that a logic value in scan register No. 3 is 1, it indicates that one of scan registers No. 3, No. 4 and No. 5 has an SA1 fault. By referring to the two results, it can be seen that the SA1 fault occurs in scan register No. 3.

Figure 3:
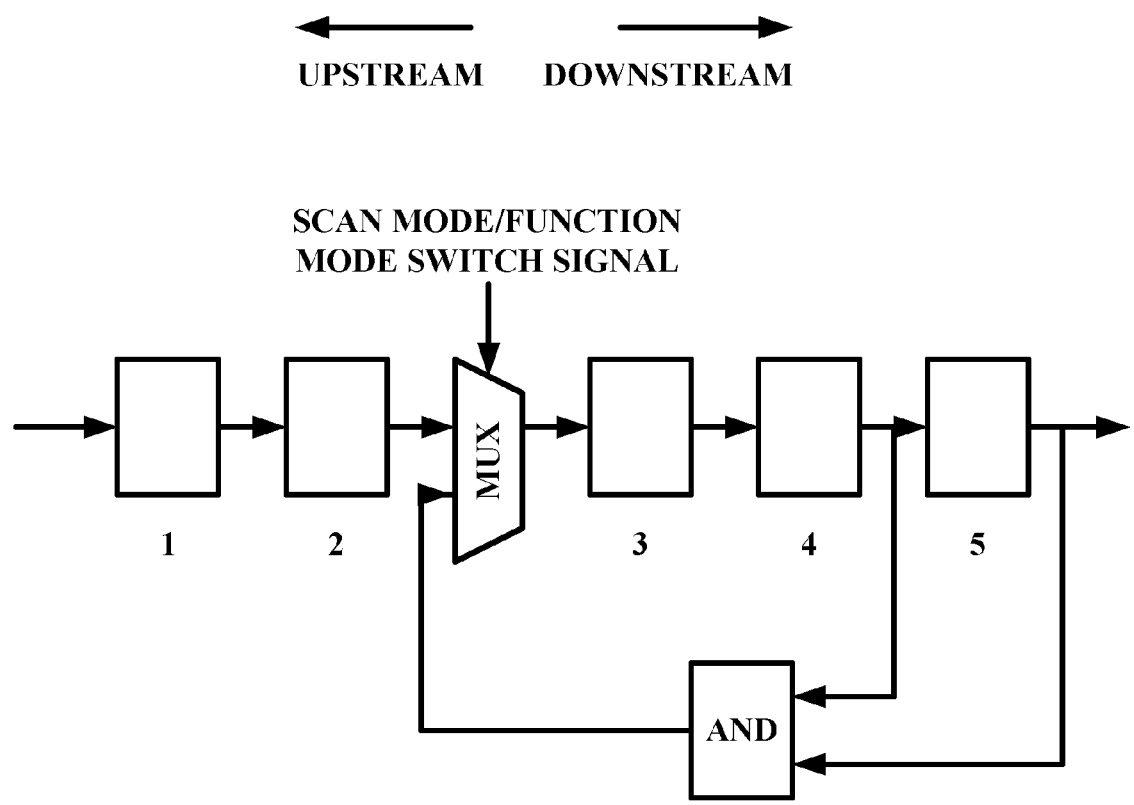
FIGS. 3, 5, 7 and 8 are respectively a schematic view of a scan chain.

When using a function module as a bypass pathway, due to possible dependency between function modules, a logic value of a downstream scan register might affect an upstream scan register. In this case, some specific logic value combinations are unlikely to be achieved. As illustrated in FIG. 3, suppose the input of scan register No. 3 is the output of AND gate, and the input of the AND gate is the output of scan register No. 4 and scan register No. 5. In this case, the logic value combination illustrated below is infeasible to the structure illustrated in FIG. 3, where X denotes a random logic value.

| No. 1 | No. 2 | No. 3 | No. 4 | No. 5 |
|---|---|---|---|---|
| X | X | 0 | 1 | 1 |

As described above, when using scan register No. 3 as a reference scan register, the shift-in logic value combination should meet the following two conditions: (1) values of downstream scan registers No. 4 and No. 5 are 1; (2) for a function unit outputted to scan register No. 3, it is necessary to control an inputted logic value of the function unit such that the function unit outputs 0 when the processing step ends. It can be easily seen that these two conditions cannot be achieved at the same time for the structure illustrated in FIG. 3.

Figure 4:
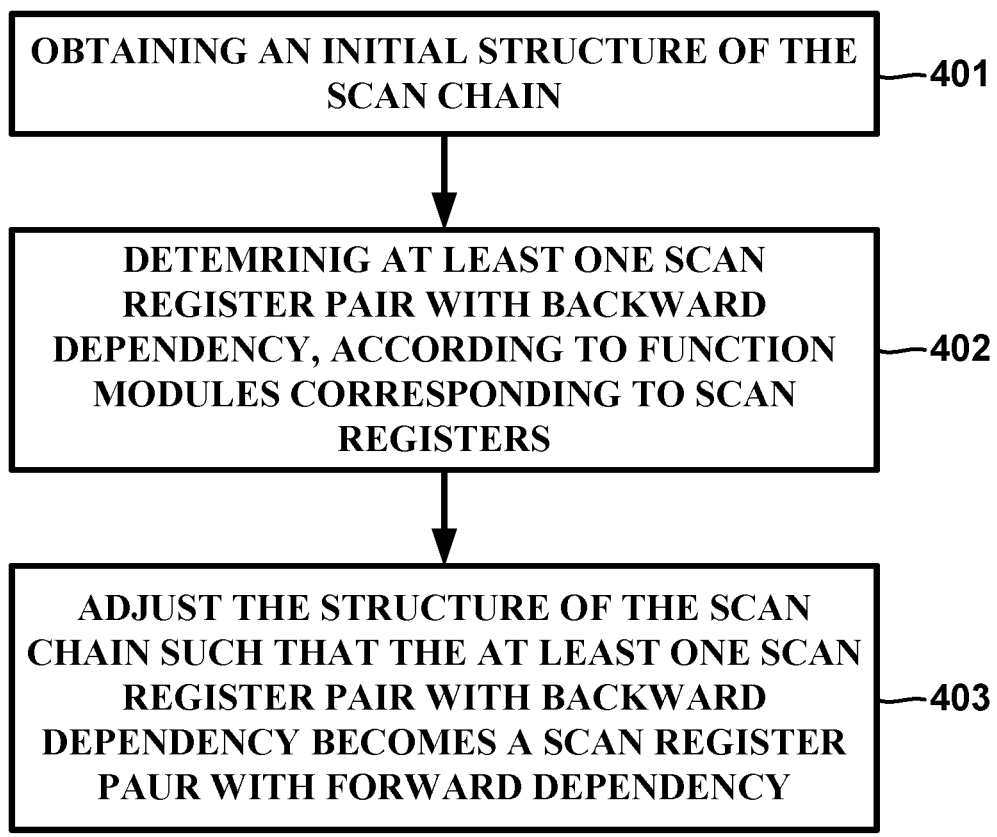
FIG. 4 is a flowchart of a method for diagnosing a scan chain according to one embodiment of the present invention.

To reduce the occurrence of phenomenon that dependency between function modules makes it impossible to locate a faulty scan chain when diagnosing scan chains by using a bypass diagnostic method, when a scan chain is added, a scan register corresponding to the output of a function module should be placed at a downstream location of the scan chain, while a scan register corresponding to the input of the function module should be placed at an upstream location of the scan chain, so as to improve the diagnosibility of the scan chain. A method for diagnosing a scan chain as illustrated in FIG. 4 may be used.

In step 401, an initial structure of the scan chain is obtained.

Scanning technology has been widely applied to physical tests of integrated circuits, which means that there are already many methods for generating the scan chain. There might be some constraints related to generating the scan chain. For example, neighboring scan registers in an integrated circuit should be arranged at adjacent locations in the scan chain. For another example, lines connecting respective scan chains should not cross. Still for another example, lines connecting scan registers should not be too long. In this step, a structure of the scan chain generated by these methods, i.e., locations of respective scan registers in the scan chain, is obtained.

In step 402, at least one scan register pair with backward dependency is obtained according to a function module corresponding to the scan register.

Since the initial structure of the scan chain is obtained in step 401, and function modules corresponding to respective scan registers are known, a scan register whose output is connected to the input of another scan register via a function module may be easily obtained. Such two scan registers have dependency. For the convenience of description, in such a scan register pair, one connected to the input of the function module is termed a fan-in scan register, and the other connected to the output of the function module is termed a fan-out scan register. In a scan register pair with dependency, if the fan-in scan register is located in the downstream of the fan-out scan register in the scan chain, then the scan register pair has backward dependency. In the case as illustrated in FIG. 3, scan register No. 3 and scan register No. 4 are a scan register pair with backward dependency, among which scan register No. 3 is a fan-out scan register and scan register No. 4 is a fan-in scan register. Similarly, scan register No. 3 and scan register No. 5 are a scan register pair with backward dependency, among which scan register No. 3 is a fan-out scan register and scan register No. 5 is a fan-in scan register. On the contrary, if a fan-in scan register is located in the upstream of a fan-out scan register in the scan chain, then the scan register pair has forward dependency.

In step 403, the structure of the scan chain is adjusted, such that the at least one scan register pair with backward dependency becomes a scan register pair with forward dependency.

In the scan register pair with reverse dependency, the fan-out scan register in the upstream of the scan chain will affect a logic value of the downstream fan-in scan register in the shift-in and shift-out steps, and the fan-in scan register in the downstream of the scan chain will affect a value of the fan-out scan register in the upstream of the scan chain in the processing step. However, such two-way impact will be avoided by converting the scan register pair with backward dependency to the scan register pair with forward dependency.

In practice, there might be a large number of scan register pairs with backward dependency. Besides, there might be a phenomenon that one fan-out scan register and multiple fan-in scan registers form scan register pairs with backward dependency. If all these scan register pairs with backward dependency are adjusted to scan register pairs with forward dependency, other constraints such as cross limit, line length and the like might not be established.

Figure 5:
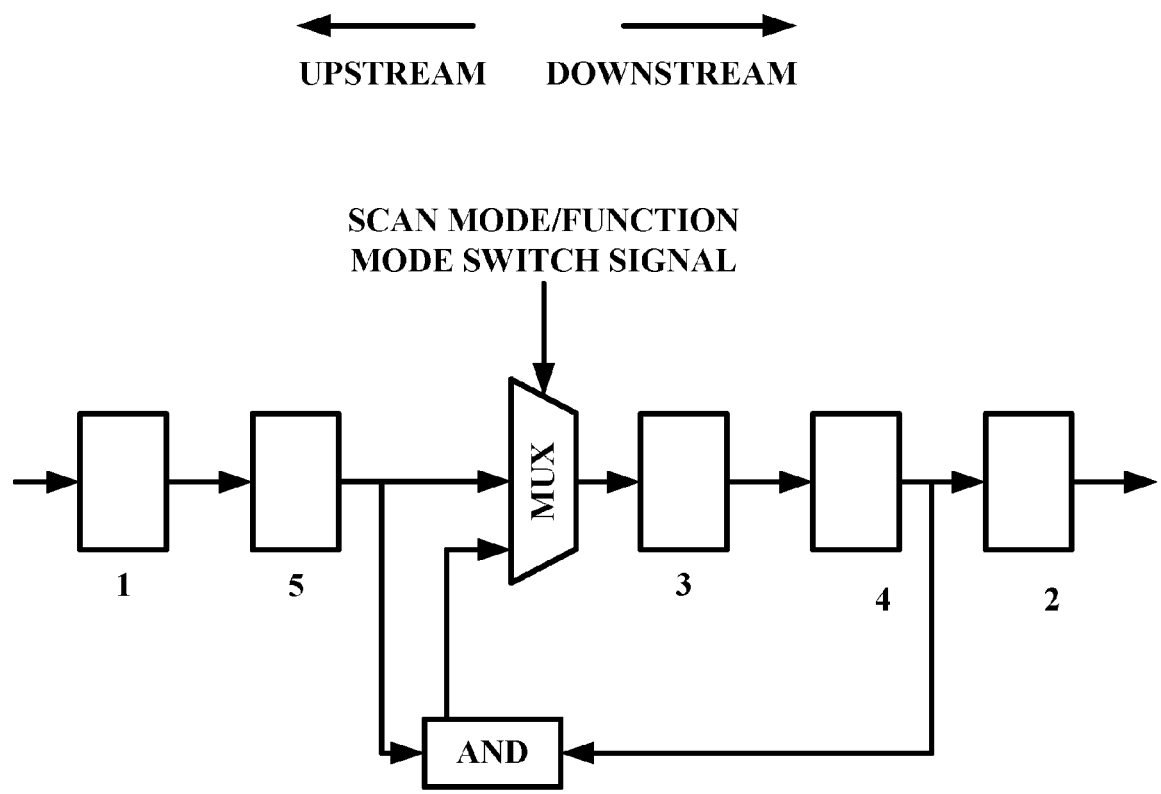
Figure 6:
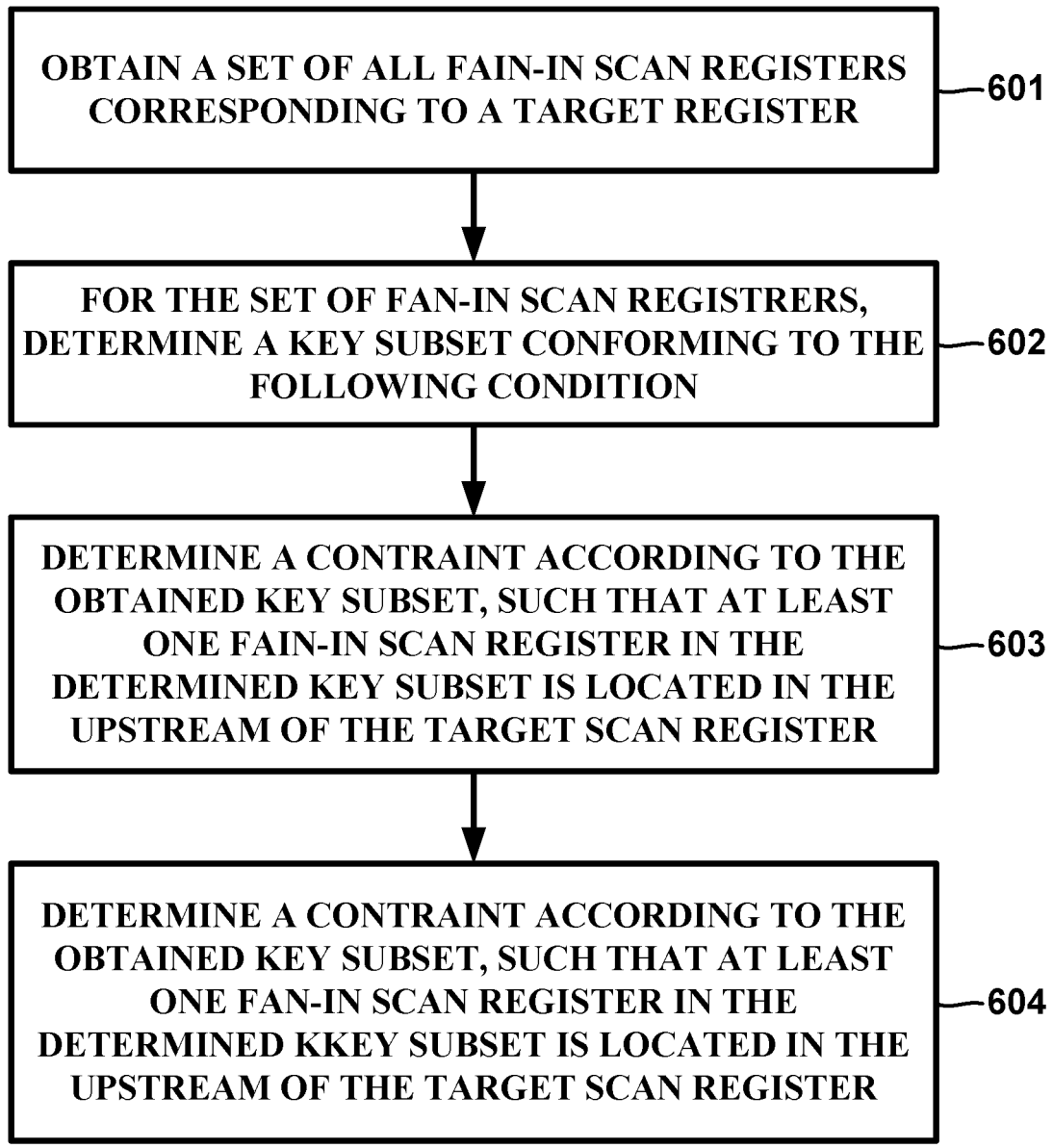
FIG. 6 is a flowchart of a method for diagnosing a scan chain according to one embodiment of the present invention.

As described above, adjusting a scan register pair with backward dependency to a scan register pair with forward dependency serves the purpose of reducing unrealizable logic value combinations for diagnosing a scan chain. Hence, there is no need to focus on logic value combinations that are not used for diagnosing a scan chain. For the scan chain structure as illustrated in FIG. 3, if it is converted to a scan chain structure as illustrated in FIG. 5, then the following logic value combination is unrealizable.

| No. 1 | No. 5 | No. 3 | No. 4 | No. 2 |
|---|---|---|---|---|
| X | 1 | 0 | 1 | X |

However, this logic value combination is not a logic value combination that is used for diagnosing a scan chain. To meet conditions (1) and (2), the following logic value combination may be used:

| No. 1 | No. 2 | No. 3 | No. 4 | No. 5 |
|---|---|---|---|---|
| X | 0 | 0 | 1 | 1 |

Specifically, values of downstream scan registers No. 4 and No. 2 are 1, and values of two registers at the input end of AND gate cause the output of AND gate to be 0. It can be seen that there is no need to move all fan-in scan registers of scan register No. 3 to the upstream of scan register No. 3.

A method for diagnosing a scan chain according to another embodiment of the present invention will be described below. The following method will be described with respect to a specific target scan register. Those skilled in the art may appreciate that the following method may be performed on all scan registers in a scan chain to obtain constraints for the whole scan chain.

In step 601, a set of all fan-in scan registers corresponding to a target scan register is obtained.

Figure 7:
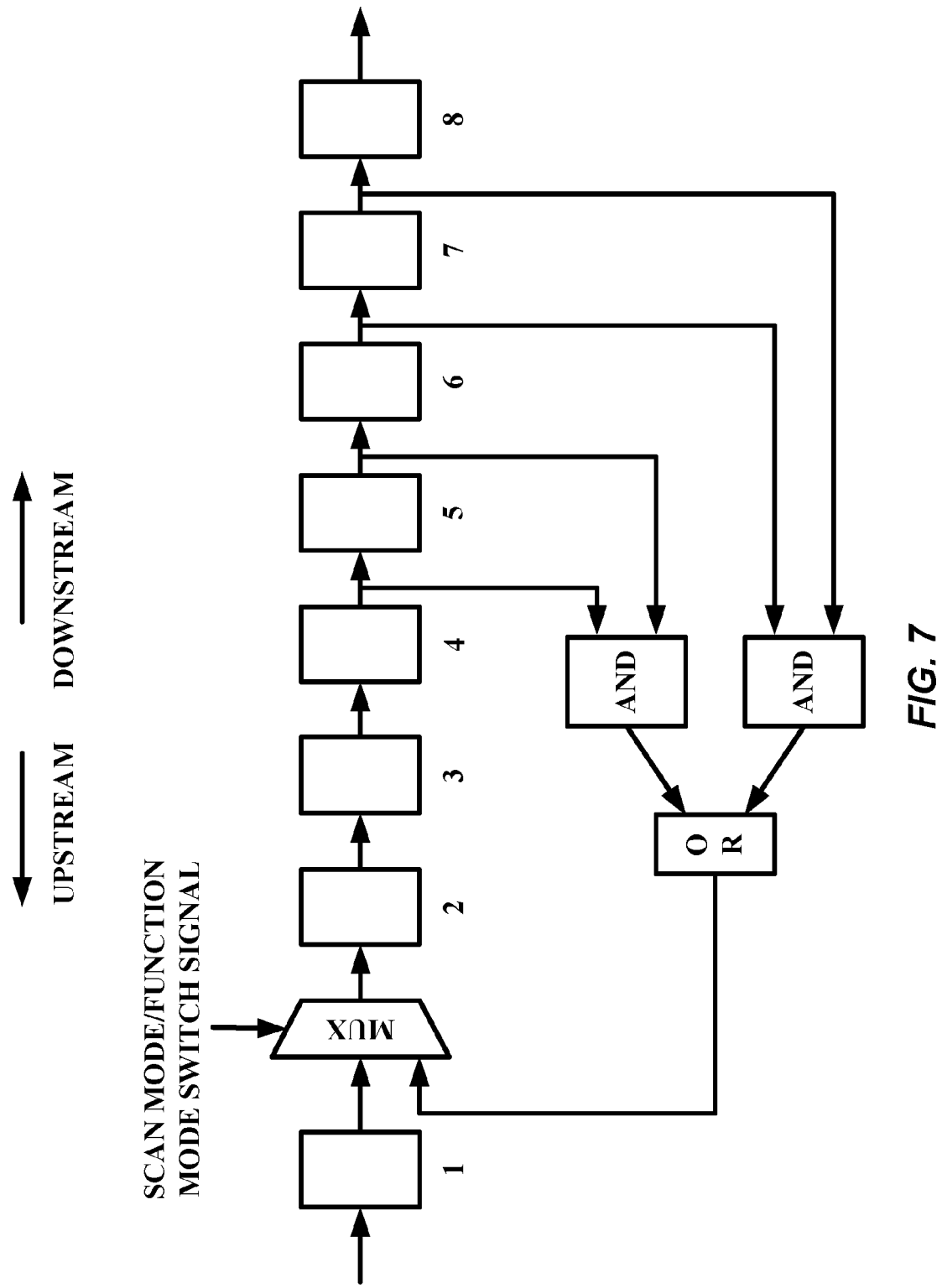

By referring to a scan chain illustrated in FIG. 7, fan-in scan registers of scan register No. 2 are scan registers No. 4, No. 5, No. 6 and No. 7. In the scan chain illustrated in FIG. 7, the output of scan registers No. 4 and No. 5 are input to OR gate through AND gate, the output of scan registers No. 6 and No. 7 are also input to OR gate through AND gate, and the output of OR gate is connected to the input of register No. 2.

Like the analysis that has been made with reference to FIG. 3, the following logic value combination is unrealizable in the scan chain illustrated in FIG. 7:

| No. 1 | No. 2 | No. 3 | No. 4 | No. 5 | No. 6 | No. 7 | No. 9 |
|---|---|---|---|---|---|---|---|
| X | 0 | 1 | 1 | 1 | 1 | 1 | 1 |

This logic value combination is used for judging whether a scan register with an SA1 fault is in scan register No. 2 and its downstream scan registers or in scan register No. 1, i.e., an upstream scan register of scan register No. 2, when scan register No. 2 is the reference scan register.

In step 602, for the set of fan-in scan registers, a key subset meeting the following condition is determined: when all fan-in scan registers in the subset take the same logic value, the output of a function module connected to the target scan register is fixed at the logic value, no matter which logic values are taken by fan-in scan registers outside the subset.

For example, in the scan chain structure illustrated in FIG. 7, if logic values of scan registers No. 4 and No. 5 are 1, then no matter which logic values are taken by scan registers No. 6 and No. 7, the output of the function module is always 1. Similarly, if logic values of scan registers No. 6 and No. 7 are 1, then no matter which logic values are taken by scan registers No. 4 and No. 5, the output of the function module is always 1. Scan registers No. 4 and No. 5 form a key subset, and scan registers No. 6 and No. 7 form another key subset.

Those skilled in the art may design various methods to seek the subset. According to one embodiment of the present invention, a signal tracing method may be used. Take the scan chain illustrated in FIG. 7 as an example, signal tracing starts at the input end of scan register No. 2 and proceeds towards fan-in scan registers of scan register No. 2. First of all, signal tracing finds OR gate. The fact that any one of inputs of OR gate is 1 will cause the output of the function module to be 1, and then registers at two input ends of OR gate will respectively form a key subset meeting the above condition. However, since these two registers are not in the scan chain, they are not included in the set of fan-in scan registers. Then signal tracing is continued, which finds two AND gates. For AND gates, only when the inputs of AND gates are 1 at the same time, will the output of the function module be 1; then, registers at two input ends of each AND gate will jointly form a key subset meeting the above condition. In FIG. 7, registers at two input ends of the first AND gate are scan registers No. 4 and No. 5, and registers at two input ends of the second AND gate are scan registers No. 6 and No. 7. In this manner, two key subsets meeting the above condition are found.

According to another embodiment of the present invention, various combinations of fan-in scan registers may be enumerated, i.e., all subsets of a set comprising all fan-in scan registers; then, it is judged one by one whether the subsets meet the above condition. Those skilled in the art may appreciate that in addition to the above-described way of forming a key subset, a subset formed by scan registers No. 4, No. 5 and No. 6 also meet the above condition, and a subset formed by scan registers No. 5, No. 6 and No. 7 also meet the above condition. According to another embodiment of the present invention, the key subset is further limited to a minimum key subset, wherein when all fan-in scan registers in the minimum key subset take the same logic value, the output of the function module connected to the fan-out scan register is fixed at the logic value, no matter which logic values are taken by fan-in scan registers outside the subset. Meanwhile, excluding any one fan-in scan register from the minimum key subset will result in that a subset formed by the remaining fan-in scan registers does not meet the definition of a key subset.

In step 603, a constraint is determined according to the obtained key subset, such that at least one fan-in scan register in the determined key subset is in the upstream of the target scan register.

In the scan chain structure illustrated in FIG. 7, a subset formed by scan registers No. 4 and No. 5 and a subset formed by scan registers No. 6 and No. 7 are two key subsets meeting the condition. Therefore, the constraint obtained in this step is that each of these two key subsets has at least one scan register that is in the upstream of scan register No. 2.

In step 604, the scan chain structure is adjusted to meet the constraint.

Figure 8:
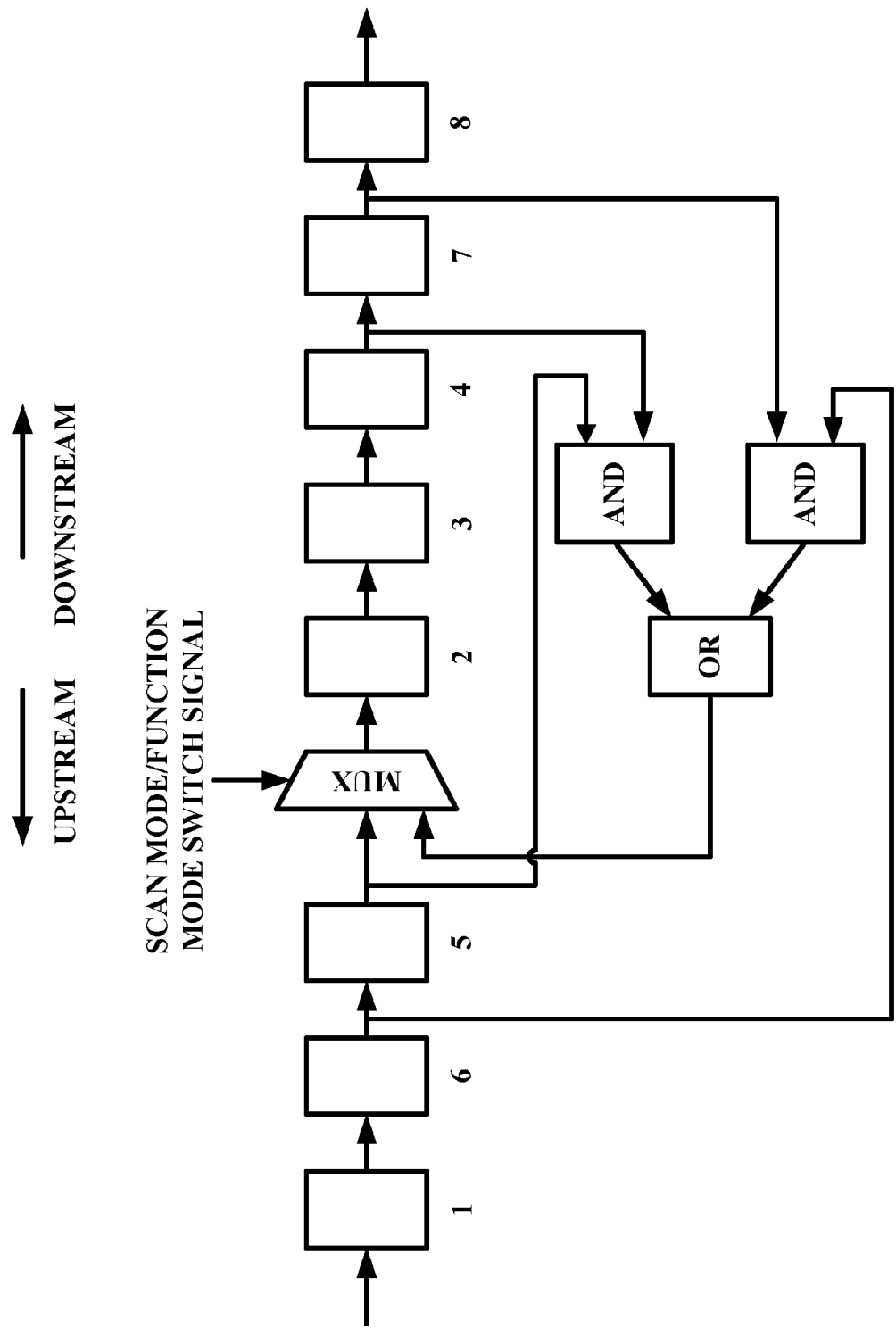

FIG. 8 illustrates an adjusted scan chain structure. In the structure illustrated in FIG. 8, a logic value combination as illustrated below may be fulfilled:

| No. 1 | No. 6 | No. 5 | No. 2 | No. 3 | No. 4 | No. 7 | No. 8 |
|---|---|---|---|---|---|---|---|
| X | 0 | 0 | 0 | 1 | 1 | 1 | 1 |

This logic value combination may be used for diagnosing a scan chain when scan register No. 2 is a reference scan register.

Those skilled in the art may appreciate that a variety of adjustment schemes may be used in order to meet the constraint in step 603. For example, as illustrated in FIG. 8, scan registers No. 5 and No. 6 may be moved to the upstream of scan register No. 2. Or scan registers No. 4 and No. 7 may be moved to the upstream of scan register No. 2. Or all of scan registers No. 4, No. 5, No. 6 and No. 7 may be moved to the upstream of scan register No. 2. On the other hand, a plurality of constraints may be obtained when performing steps 601 to 603 with respect to each target scan register in the scan chain. It is necessary to select an adjustment scheme corresponding to each constraint, so as to meet the constraints as much as possible.

For example, suppose in the scan chain structure illustrated in FIG. 7 there is another function module such that scan registers No. 4 and No. 7 form a key subset meeting the above condition with respect to scan register No. 6. At this point, if the scan chain structure is adjusted as the structure illustrated in FIG. 8, then scan registers No. 4 and No. 7 are in the downstream of scan register No. 6, which does not meet the constraint determined with respect to scan register No. 6. In the scan chain structure illustrated in FIG. 7, if scan registers No. 5 and No. 7 are moved to the upstream of scan register No. 2, then not only the constraint determined with respect to scan register No. 2 but also the constraint determined with respect to scan register No. 6 are met.

Those skilled in the art may design a plurality of methods for designing adjustment schemes so as to meet the constraint determined for the whole scan chain as much as possible, which is not detailed here.

Figure 9:
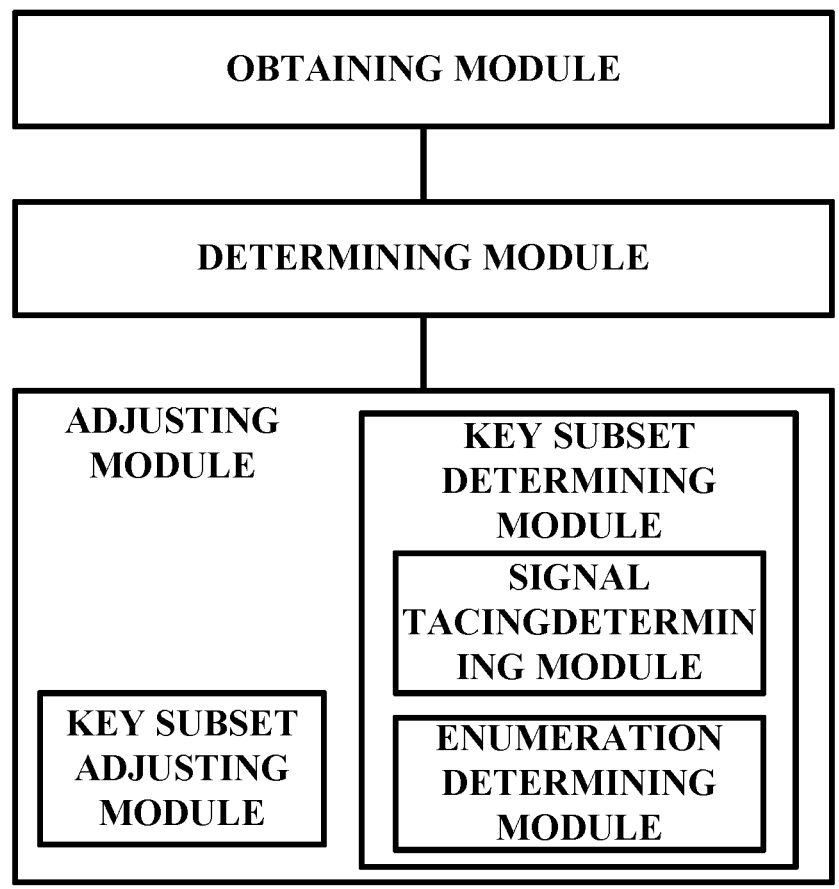
FIG. 9 is a block diagram of an apparatus for diagnosing a scan chain according to one embodiment of the present invention.

FIG. 9 illustrates a block diagram of an apparatus for diagnosing a scan chain according to one embodiment of the present invention.

An apparatus for a scan chain according to one embodiment of the present invention comprises:

an obtaining module configured to obtain an initial structure of the scan chain;

a determining module configured to determine at least one scan register pair with backward dependency, according to function modules corresponding to scan registers on the scan chain; and an adjusting module configured to adjust the structure of the scan chain such that the at least one scan register pair with backward dependency becomes a scan register pair with forward dependency.

The adjusting module comprises:

a key subset determining module configured to determine a key subset of a fan-out scan register in the at least one scan register pair with backward dependency;

a key subset adjusting module configured to, in the case that a fan-in scan register in the scan register pair with backward dependency belongs to the key subset of the fan-out scan register in the scan register pair with backward dependency, adjust the structure of the scan chain such that the at least one scan register pair with backward dependency becomes the scan register pair with forward dependency, wherein when all fan-in scan registers in the key subset take the same logic value, an output of a function module connected to the fan-out scan register is fixed as the logic value, no matter which logic values are taken by fan-in scan registers outside the subset.

The key subset determining module comprises:

a signal tracing determining module configured to determine the key subset by a signal tracing method.

The key subset determining module comprises:

an enumeration determining module configured to determine the key subset by an enumeration method.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks illustrated in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for implementing a scan chain to test a semiconductor, the method comprising:

obtaining an initial structure of the scan chain;

determining, according to function modules of the semiconductor corresponding to scan registers on the scan chain, at least one scan register pair with backward dependency;

adjusting the initial structure of the scan chain such that the at least one scan register pair with backward dependency becomes a scan register pair with forward dependency; and determining a key subset of a fan-out scan register in the at least one scan register pair with backward dependency, wherein a fan-in scan register in the at least one scan register pair with backward dependency belongs to the key subset of the fan-out scan register, wherein logic values of all fan-in scan registers in the key subset and a logic value of an output of a function module connected to the fan-out scan register are the same, no matter which logic values are taken by fan-in scan registers outside the key subset.

2. The method according to claim 1, wherein excluding any fan-in scan register from the key subset will result in a new subset of fan-out scan registers formed by the remaining fan-in scan registers that do not conform to a definition of the key subset.

3. The method according to claim 1, wherein determining the key subset of the fan-out scan register in the at least one scan register pair with backward dependency comprises:

determining the key subset by a signal tracing method.

4. The method according to claim 1, wherein the determining the key subset of the fan-out scan register in the at least one scan register pair with backward dependency comprises:

determining the key subset by an enumeration method.

5. An apparatus for a scan chain, the apparatus comprising:

an obtaining module configured to obtain an initial structure of the scan chain;

a determining module configured to determine, according to function modules corresponding to scan registers on the scan chain, at least one scan register pair with backward dependency; and an adjusting module configured to adjust the initial structure of the scan chain such that the at least one scan register pair with backward dependency becomes a scan register pair with forward dependency, the adjusting module comprising:

a key subset determining module configured to determine a key subset of a fan-out scan register in the at least one scan register pair with backward dependency;

a key subset adjusting module configured to adjust the initial structure of the scan chain such that the at least one scan register pair with backward dependency becomes the scan register pair with forward dependency, wherein a fan-in scan register in the at least one scan register pair with backward dependency belongs to the key subset of the fan-out scan register in the at least one scan register pair with backward dependency, and wherein logic values of all fan-in scan registers in the key subset and a logic value of an output of a function module connected to the fan-out scan register are the same, no matter which logic values are taken by fan-in scan registers outside the key subset.

6. The apparatus according to claim 5, wherein excluding any fan-in scan register from the key subset will result in a new subset of fan-out scan registers formed by the remaining fan-in scan registers that do not conform to a definition of the key subset.

7. The apparatus according to claim 5, wherein the key subset determining module comprises:

a signal tracing determining module configured to determine the key subset by a signal tracing method.

8. The apparatus according to claim 5, wherein the key subset determining module comprises:

an enumeration determining module configured to determine the key subset by an enumeration method.

\* \* \* \* \*